United States Patent
Himi et al.

(10) Patent No.: US 7,754,580 B2
(45) Date of Patent: Jul. 13, 2010

(54) METHOD FOR MANUFACTURING SEMICONDUCTOR SUBSTRATE

(75) Inventors: Hiroaki Himi, Nagoya (JP); Noriyuki Iwamori, Okazaki (JP)

(73) Assignee: DENSO CORPORATION, Kariya (JP)

(*) Notice: Subject to any disclaimer, the term of this patent is extended or adjusted under 35 U.S.C. 154(b) by 247 days.

(21) Appl. No.: 11/783,765

(22) Filed: Apr. 12, 2007

(65) Prior Publication Data

US 2007/0194413 A1    Aug. 23, 2007

Related U.S. Application Data

(62) Division of application No. 10/716,606, filed on Nov. 20, 2003, now Pat. No. 7,220,654, which is a division of application No. 09/713,018, filed on Nov. 16, 2000, now Pat. No. 6,676,748.

(30) Foreign Application Priority Data

Nov. 17, 1999 (JP) ................. 11-326934
Oct. 31, 2000 (JP) ................. 2000-333286

(51) Int. Cl.
H01L 21/30 (2006.01)

(52) U.S. Cl. ............... 438/455; 438/459; 257/E21.122

(58) Field of Classification Search ............... 438/455, 438/457–459; 257/E21.122
See application file for complete search history.

(56) References Cited

U.S. PATENT DOCUMENTS

| | | | |
|---|---|---|---|
| 4,376,138 A | 3/1983 | Alferness et al. | |
| 4,401,506 A | 8/1983 | Otsuka | |
| 4,459,159 A | 7/1984 | O'Mara | |
| 4,469,527 A | 9/1984 | Sugano et al. | |
| 4,834,809 A | 5/1989 | Kakihara | |
| 5,021,361 A | 6/1991 | Kinoshita | |
| 5,115,283 A | 5/1992 | Blondeau et al. | |
| 5,141,879 A | 8/1992 | Goronkin et al. | |
| 5,144,377 A | 9/1992 | Barnett et al. | |
| 5,238,875 A * | 8/1993 | Ogino ................ 438/459 |
| 5,611,855 A | 3/1997 | Wijaranakula | |
| 5,734,195 A | 3/1998 | Takizawa et al. | |
| 5,742,093 A | 4/1998 | Kunihiro | |

(Continued)

FOREIGN PATENT DOCUMENTS

EP    0 352 801    1/1990

(Continued)

OTHER PUBLICATIONS

Communication from European Patent Office dated Jul. 27, 2004 for the counterpart application No. 00125154.5-1528.

(Continued)

*Primary Examiner*—Thanhha Pham
(74) *Attorney, Agent, or Firm*—Posz Law Group, PLC

(57) ABSTRACT

An epitaxial layer is formed on a high-resistance semiconductor substrate containing interstitial oxygen at a high concentration, and then a heat treatment is performed to the semiconductor substrate at a high temperature in an oxidizing atmosphere. Accordingly, a stratiform region of $SiO_2$ is formed by deposition at an interface between the epitaxial layer and the semiconductor substrate. As a result, an apparent SOI substrate for an SOI semiconductor device can be manufactured at a low cost.

1 Claim, 11 Drawing Sheets

U.S. PATENT DOCUMENTS

| | | | |
|---|---|---|---|
| 5,930,642 A | 7/1999 | Moore et al. | |
| 5,939,770 A | 8/1999 | Kageyama | |
| 5,961,713 A | 10/1999 | Wijaranakula | |

FOREIGN PATENT DOCUMENTS

| | | |
|---|---|---|
| EP | 0 697 713 | 2/1996 |
| JP | 56-164547 | 12/1981 |
| JP | A-59-188925 | 10/1984 |
| JP | 63-29937 | 2/1988 |
| JP | 64-11316 | 1/1989 |
| JP | 1-290229 | 11/1989 |
| JP | A-2-237033 | 9/1990 |
| JP | A-3-84931 | 4/1991 |
| JP | 3-181115 | 8/1991 |
| JP | A-4-79372 | 3/1992 |
| JP | 5-235007 | 9/1993 |
| JP | A-6-338507 | 6/1994 |
| JP | 6-283693 | 10/1994 |

OTHER PUBLICATIONS

Communication from European Patent Office dated Jun. 17, 2005.
Examination Report from European Patent Office issued on Sep. 14, 2006 for the corresponding European patent application No. 00 125 154.5-1528 (a copy and English translation thereof).

* cited by examiner

METHOD FOR MANUFACTURING SEMICONDUCTOR SUBSTRATE

CROSS REFERENCE TO RELATED APPLICATIONS

This application is a divisional application of U.S. patent application Ser. No. 10/716,606 filed on Nov. 20, 2003 now U.S. Pat. No. 7,220,654, which is a divisional application of U.S. patent application Ser. No. 09/713,018 filed on Nov. 16, 2000 (now U.S. Pat. No. 6,676,748), which is based upon and claims benefit of Japanese Patent Applications No. 11-326934 filed on Nov. 17, 1999, and No. 2000-333286 filed on Oct. 31, 2000, the contents of which are incorporated herein by reference.

BACKGROUND OF THE INVENTION

1. Field of the Invention

This invention relates to a method for manufacturing a semiconductor substrate that is generally used for a semiconductor device including a composite IC and an LSI.

2. Description of the Related Art

An SOI (Silicon On Insulator) semiconductor device has a semiconductor layer that is disposed on a semiconductor substrate through an intermediate insulating layer. Such an SOI substrate is suitably, used for a device such as a composite IC, a high withstand voltage IC or an LSI for a portable instrument that is required to have high speed and low consumption power, in which several kinds of elements such as bipolar, MOS, and power elements are mounted on one chip.

To manufacture the SOI semiconductor device, an SOI substrate is required, which includes a high-quality crystalline semiconductor layer that is formed on a layer made of an insulating material such as $SiO_2$ with extremely high resistance. Known conventional methods for manufacturing the SOI substrates include a bonding method, a SIMOX method, a method that combines bonding and ion implantation by utilizing hydrogen brittleness, and the like.

However, the SOI substrate manufactured by conventional techniques in any of the above-described methods is several to several dozen times more expensive than an ordinary bulk substrate. This is the biggest reason for preventing the SOI semiconductor device from being practically used, regardless of its inherent high performance and high functionality.

SUMMARY OF THE INVENTION

The present invention has been made in view of the above problems. An object of the present invention is to provide a method for manufacturing a semiconductor substrate suitably used for an SOI semiconductor device, with high quality at low cost.

Briefly, according to a first aspect of the present invention, after an epitaxial layer is formed on a semiconductor substrate, an insulating layer is formed by deposition at an interface between the epitaxial layer and the semiconductor substrate by performing a heat treatment in an oxidizing atmosphere. Thus, the semiconductor substrate for an SOI semiconductor device can be manufactured easily at low cost. A thickness of an SOI layer required for the semiconductor device can be determined by the thickness of the epitaxial layer.

According to a second aspect of the present invention, an apparent SOI substrate can be formed by epitaxially growing a semiconductor layer on a semi-insulating substrate having a high resistance. Preferably, before the semiconductor layer is epitaxially grown on the substrate, a heat treatment is performed in a hydrogen atmosphere to improve crystallinity on a surface of the semiconductor substrate. Accordingly, the crystallinity of the semiconductor layer is further improved.

According to a third aspect of the present invention, a base wafer and a bonding wafer are prepared, one of which is composed of a semiconductor substrate containing oxygen at a high concentration or a semi-insulating semiconductor substrate having a high resistance. An oxide film is formed on one of the base wafer and the bonding wafer. Then, the base wafer and the bonding wafer are bonded together with the oxide film interposed therebetween. After that, a back surface of the bonding wafer at an opposite side of the base wafer is ground and polished to form an SOI layer on the base wafer through the oxide film.

According to fourth aspect of the present invention, first, an element is ion-implanted into a high resistance semiconductor substrate, containing oxygen at a high concentration, to form a deposition nuclear layer by the element. The deposition nuclear layer has a plurality of nuclei for deposition and extends at a depth from a surface of the semiconductor substrate. Then, a heat treatment is performed to the semiconductor substrate to form an oxide layer in the semiconductor substrate by making the oxygen, contained in the semiconductor substrate, deposit using the plurality of nuclei in the deposition nuclear layer.

According to the present invention described above, in any case, the semiconductor substrate for an SOI semiconductor device can be manufactured with high quality at significantly reduced low cost.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

First Embodiment

Figure 1A:
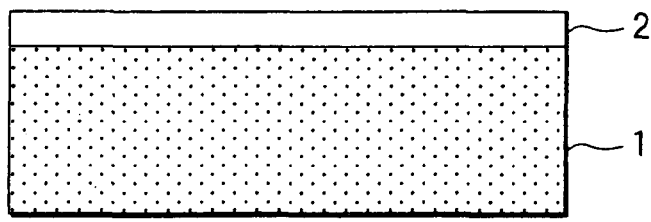
FIGS. 1A and 1B are cross-sectional views showing steps for manufacturing a semiconductor substrate for an SOI semiconductor device in a first preferred embodiment.
Figure 1B:
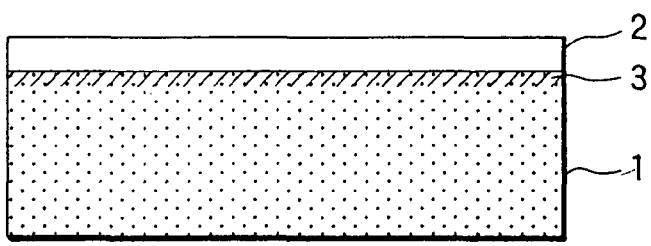

A method for manufacturing a semiconductor substrate for an SOI semiconductor device to which a first preferred embodiment of the invention is applied is explained referring to FIGS. 1A and 1B.

In the first embodiment, a high-resistance semiconductor substrate 1 having a mirror-finished surface and including interstitial oxygen at a high concentration is used as a substrate for epitaxial growth. While silicon single crystal that has been grown by a CZ method contains oxygen of about $10^{17}$ atoms/cm$^3$ among lattices therein, a mirror wafer containing interstitial oxygen at a higher concentration of, for example, more than $1 \times 10^{18}$ atoms/cm$^3$ is used as a start material in this embodiment. The mirror wafer can be manufactured by the CZ method similarly to ordinary mirror wafers.

This semiconductor substrate 1 undergoes a pre-cleaning treatment including, for example, an immersion treatment into SC-1 solution (mixture composed of $NH_4OH$, $H_2O_2$, and $H_2O$, APM solution), an immersion treatment into SC-2 solution (mixture composed of HCl, $H_2O_2$, and $H_2O$, HPM solution), an immersion treatment into dilute HF solution, super-pure water substitution, and drying. Then, an epitaxial layer (semiconductor active layer) 2 is formed in accordance with a required thickness by epitaxial growth involving HCl etching, $H_2$ gas substitution, and the like within an epitaxial apparatus.

After that, the semiconductor substrate 1 on which the epitaxial layer 2 is formed is heated at a high temperature of, for example, 1150° C. or more, in oxidizing atmosphere. Accordingly, oxygen in the high-resistance semiconductor substrate 1 containing interstitial oxygen at a high concentration is deposited using as nuclei a distortion layer at the interface between the epitaxial layer 2 and the semiconductor substrate 1. In consequence, a stratiform region (oxide film) 3 of $SiO_2$ is formed at the interface between the epitaxial layer 2 and the semiconductor substrate 1, thereby forming an SOI structure. The stratiform region 3 of $SiO_2$ formed at the interface is about 100 nm in thickness. However, since the semiconductor substrate 1 used has high resistance, the stratiform region 3 can electrically isolate elements in cooperation with trench isolation, and realize performances equivalent to those of an ordinary SOI substrate.

The method for manufacturing the semiconductor substrate for an SOI semiconductor device described above can dispense with many steps such as preparation of two mirror wafers for bonding, bonding of the two mirror wafers, heat treatment for bonding, edge treatment for obtaining a required SOI thickness, surface grinding; re-polishing for mirror finish, and several checks for voids, SOI thickness, and the like, in comparison with a conventional bonding method. In consequence, significant cost reduction can be achieved. Also, in comparison with a SIMOX method, the SIMOX method necessitates an expensive apparatus and its throughput is low because oxygen must be ion-implanted into a semiconductor substrate with high energy to have a high concentration ($1 \times 10^{18}$ cm$^{-3}$). To the contrary, in the present invention, the $SiO_2$ stratiform region 3 can be formed by using the semiconductor substrate containing interstitial oxygen at a high concentration, and performing only the ordinary epitaxial growth for the active layer and the heat treatment in oxidizing atmosphere. Therefore, significant cost reduction can be realized in the present embodiment.

Second Embodiment

Figure 2:
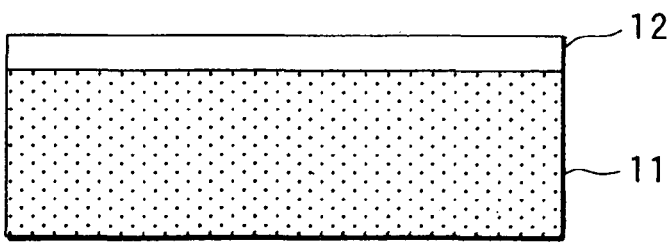
FIG. 2 is a cross-sectional view showing a step for manufacturing a semiconductor substrate for an SOI semiconductor device in a second preferred embodiment.

FIG. 2 shows a second preferred embodiment of the present invention. In this embodiment, a semi-insulating semiconductor substrate 11 is used in place of the semiconductor substrate 1 used in the first embodiment. An epitaxial layer 12 can be formed on the semiconductor substrate 11 similarly to the first embodiment. Accordingly, an apparent SOI structure can be constructed without performing an oxygen deposition heat treatment at a high temperature in oxidizing atmosphere after the epitaxial layer 12 is formed.

Figure 3:
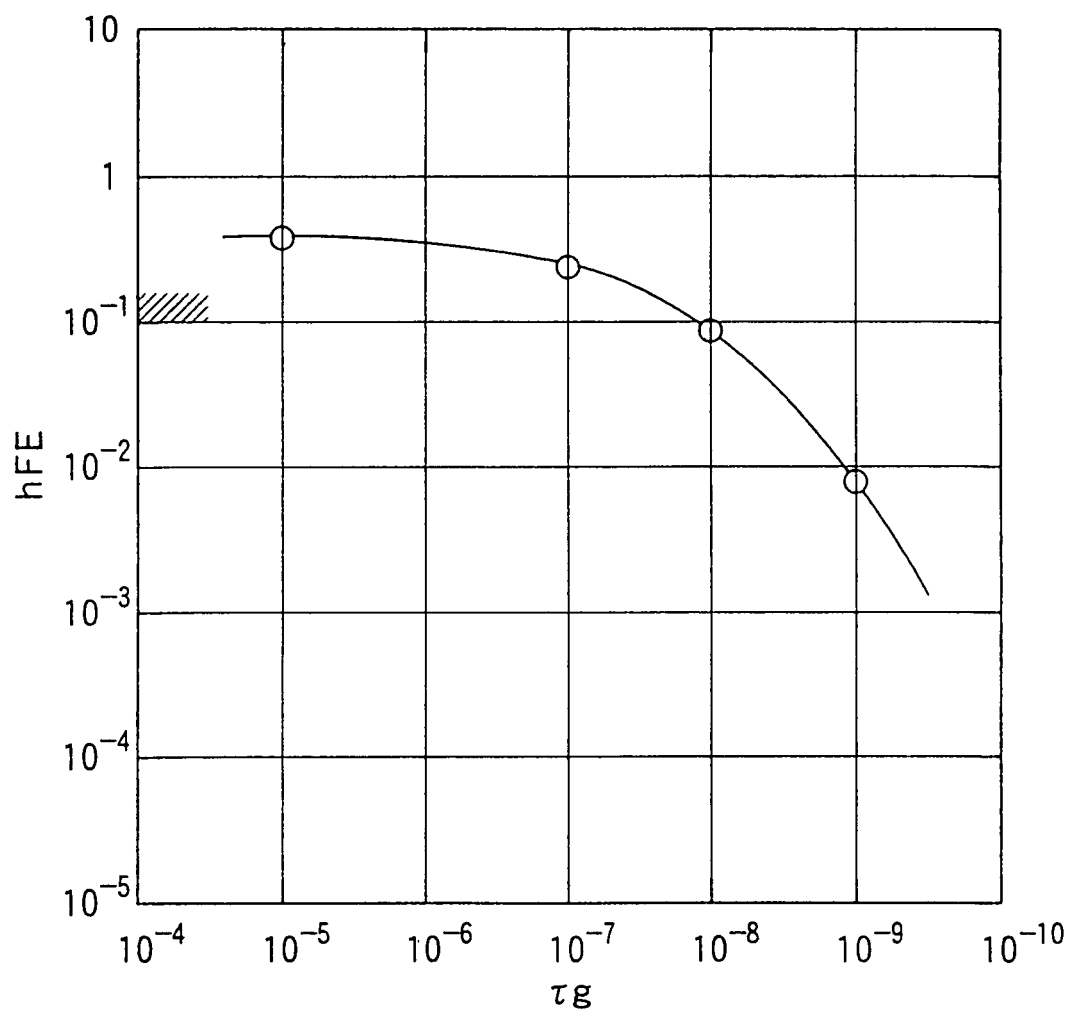
FIG. 3 is a graph showing a relation between hFE of a parasitic transistor and minority carrier lifetime.

For example, a substrate having a lifetime of a minority carrier (minority carrier lifetime) less than about $1 \times 10^{-8}$ sec and a carrier concentration less than about $1 \times 10^{14}$ cm$^{-3}$ can be used as the semi-insulating semiconductor substrate 11 in this embodiment. This is because, in a state where elements are formed with impurity layers in the epitaxial layer 12 and the semiconductor substrate 11 adjacently to each other, hFE of a parasitic transistor formed by the impurity layers of the adjacent elements and the semiconductor substrate 11 and the minority carrier lifetime $\tau$ g have a relation as shown in FIG. 3. That is, referring to FIG. 3, it is preferable that hFE of the parasitic transistor is less than about $10^{-1}$ to negligibly decrease the effect by the parasitic transistor, and hFE of the parasitic transistor becomes less than about $10^{-1}$ when the minority carrier lifetime $\tau$ g is less than abut $1 \times 10^{-8}$ sec. Therefore, the minority carrier lifetime is determined as described above.

The carrier concentration of the semiconductor substrate 11 is not limited, and for example, may be $1 \times 10^{14}$ cm$^{-3}$ or less. The semi-insulating semiconductor substrate 11 may be a substrate containing an impurity that forms a deep trap level in a bandgap of high concentration interstitial oxygen, carbon, or the like.

Third Embodiment

Figure 4:
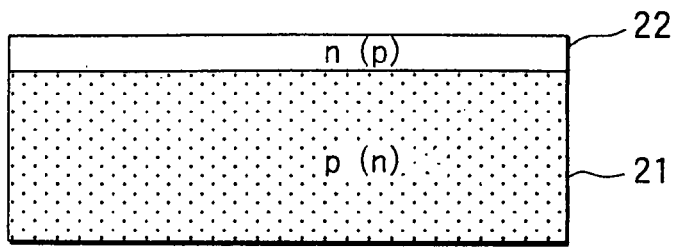
FIG. 4 is a cross-sectional view showing a step for manufacturing a semiconductor substrate for an SOI semiconductor device in a third preferred embodiment.

FIG. 4 shows a third preferred embodiment of the present invention. In this embodiment, a semi-insulating semiconductor substrate 21 doped with a dopant, a conductivity type of which is opposite to that of an epitaxial layer 22 is used in place of the semiconductor substrate 11 in the second embodiment. As shown in the figure, specifically, when the epitaxial layer 22 is n type, the semiconductor substrate 21 is p type, and when the epitaxial layer 22 is p type, the semiconductor substrate 21 is n type. Accordingly, because a PN junction is provided between the epitaxial layer 22 and the semiconductor substrate 21, electrical insulation can be achieved more securely than in the second embodiment.

Fourth Embodiment

Figure 5A:
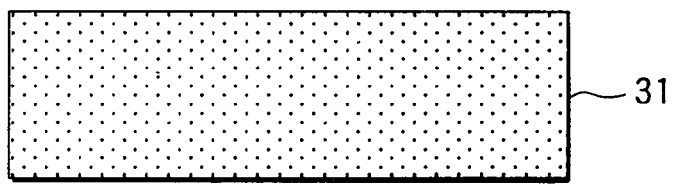
FIGS. 5A to 5C are cross-sectional views showing steps for manufacturing a semiconductor substrate for an SOI semiconductor device in a fourth preferred embodiment.
Figure 5B:
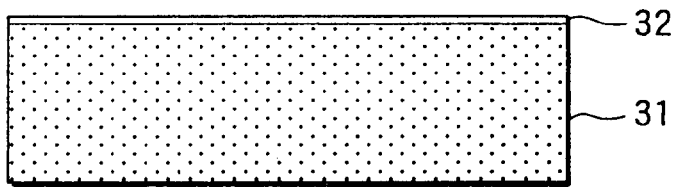
Figure 5C:
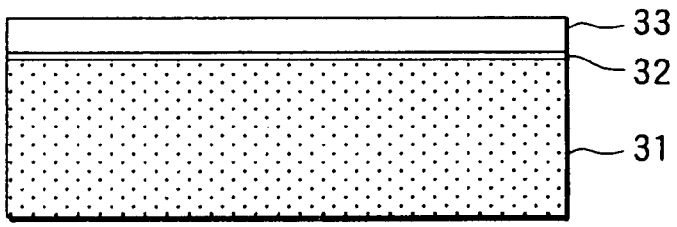

FIGS. 5A to 5C show a fourth preferred embodiment of the present invention. In this embodiment, similarly to the first to third embodiments, a high-resistance semiconductor substrate containing interstitial oxygen at a high concentration or semi-insulating substrate is used as a semiconductor substrate 31 (FIG. 5A). Then, a high temperature heat treatment is performed to the semiconductor substrate 31 at, for example, 1000° C. or more in hydrogen atmosphere before performing epitaxial growth.

Accordingly, there arise both or either of phenomena that interstitial oxygen atoms contained in the substrate are outwardly diffused and released from the surface of the substrate, and that atoms forming the surface of the substrate are rearranged. Then, a layer 32 is formed at the substrate surface by outward diffusion of oxygen or/and rearrangement of atoms (FIG. 5B), so that the crystallinity of the substrate surface is improved. Because of this, an epitaxial layer 33 formed thereafter can have further improved crystallinity.

Fifth Embodiment

Figure 6A:
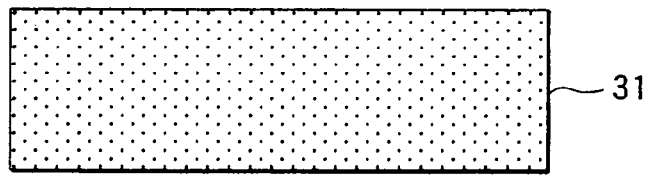
FIGS. 6A to 6D are cross-sectional views showing steps for manufacturing a semiconductor substrate for an SOI semiconductor device in a fifth preferred embodiment.
Figure 6B:
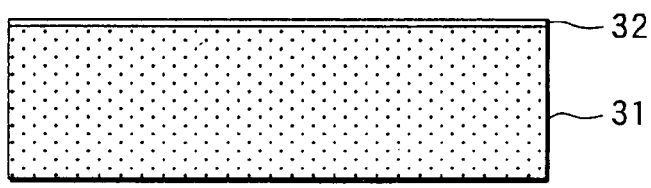
Figure 6C:
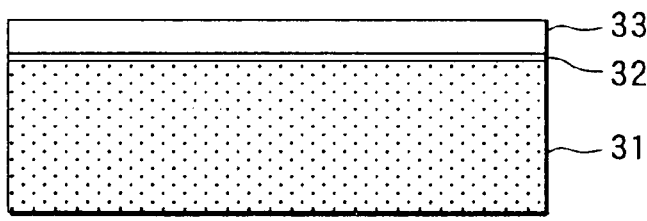
Figure 6D:
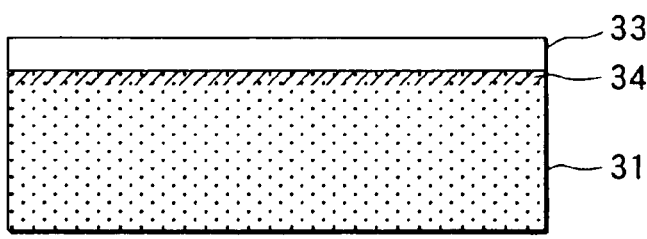

FIGS. 6A to 6D show a fifth preferred embodiment of the present invention. Incidentally, steps shown in FIGS. 6A to 6C are substantially the same as those shown in FIGS. 5A to 5C. In this embodiment, an epitaxial growth substrate that is fabricated by the method described in the fourth embodiment is heated at a high temperature of, for example, 1150° C. or more, in oxidizing atmosphere (FIG. 6D).

Accordingly, oxygen in the high-resistance semiconductor substrate 31 that contains interstitial oxygen at a high concentration is deposited using as nuclei a distortion layer at the interface between the epitaxial growth layer and the substrate so that a $SiO_2$ stratiform region 34 can be formed by additionally performing the heat treatment in the oxidizing atmosphere as in the first embodiment.

Sixth Embodiment

Figure 7A:
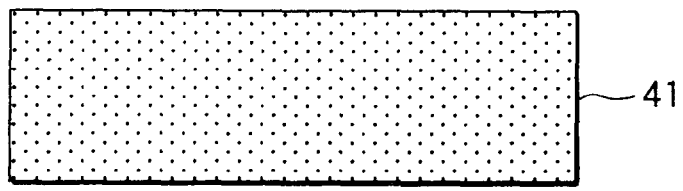
FIGS. 7A to 7C are cross-sectional views showing steps for manufacturing a semiconductor substrate for an SOI semiconductor device in a sixth preferred embodiment.
Figure 7B:
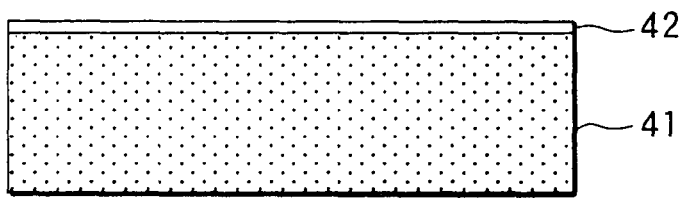
Figure 7C:
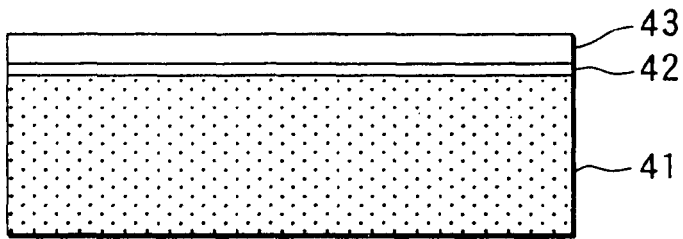

FIGS. 7A to 7C show a sixth preferred embodiment of the present invention. In this embodiment, as in the first to third embodiments, a high-resistance semiconductor substrate containing interstitial oxygen at a high concentration or semi-insulating substrate is used as a semiconductor substrate 41 (FIG. 7A), and a thin semiconductor layer 42 is epitaxially grown to have a conductive type opposite to that of an epitaxial layer 43 that is formed in a subsequent step as an active layer (FIG. 7B). Successively, the epitaxial layer 43 is epitaxial grown (FIG. 7C). For example, when the active layer (epitaxial layer 43) is formed to be an $n^-$ type layer, the semiconductor layer 42 is formed to be a $p^-$ type layer.

According to this manufacturing method, the semiconductor layer 42, which is formed at the interface between the semiconductor substrate 41 and the epitaxial layer 43 and has the conductivity type opposite to that of the active layer, can be completely depleted to support voltage and to perform insulating isolation in cooperation with the underlying high-resistance semiconductor substrate 41. As a result, the semiconductor layer 42 can provide an apparent SOI structure. As in the first embodiment, a heat treatment may be performed in high-temperature oxidizing atmosphere to form an oxide layer deposited.

Seventh Embodiment

Figure 8A:
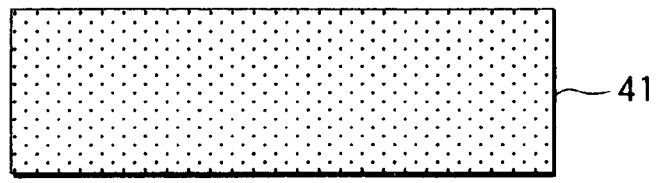
FIGS. 8A to 8D are cross-sectional views showing steps for manufacturing a semiconductor substrate for an SOI semiconductor device in a seventh preferred embodiment.
Figure 8B:
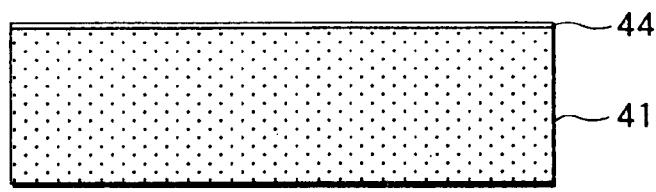

FIGS. 8A to 8D show a seventh preferred embodiment of the present invention. In this embodiment, before the epitaxial growth in the sixth embodiment is performed, similarly to the fourth and fifth embodiments, the step shown in FIG. 5B is performed to the semiconductor substrate 41. That is, a high temperature heat treatment is performed at, for example, 1000° C. or more in hydrogen atmosphere. Accordingly, both or either of phenomenon that interstitial oxygen contained in the semiconductor substrate 41 is outwardly diffused to be released from the substrate surface, and atoms constituting the substrate surface are rearranged occur, and a layer 44 is formed at the substrate surface due to outward diffusion of oxygen and rearrangement of atoms (FIG. 8B). As a result, the crystallinity of the substrate surface is improved.

Figure 8C:
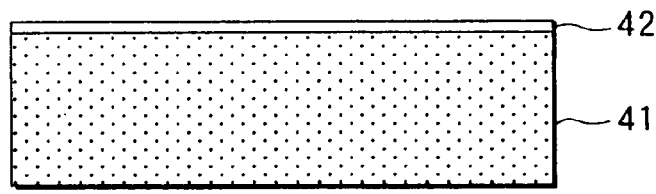
Figure 8D:
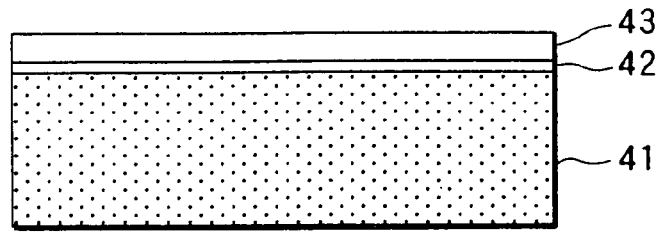

After that, as shown in FIGS. 8C and 8D, the similar steps to those shown in FIGS. 7B and 7C are performed to form an apparent SOI substrate. Incidentally, also in the present embodiment, a heat treatment may be performed in a high-temperature oxidizing atmosphere to make an oxide layer deposited as in the fifth embodiment.

Eighth Embodiment

Figure 9A:
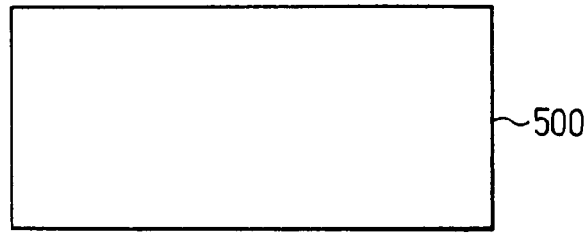
FIGS. 9A to 9D are cross-sectional views showing steps for manufacturing a semiconductor substrate for an SOI semiconductor device in an eighth preferred embodiment.

FIGS. 9A to 9D shows an eighth preferred embodiment of the present invention. This embodiment uses a high-resistance semiconductor substrate 500 having a mirror-finished surface and containing oxygen at a high concentration (FIG. 9A). Then, first, a pad oxide film (not shown) having a thickness of about 45 nm is formed on the surface by performing a heat treatment in oxidizing atmosphere. This step is performed in an ordinary semiconductor process to prevent occurrence of channeling components along crystal axes and sputters on the surface by ion implantation.

Figure 9B:
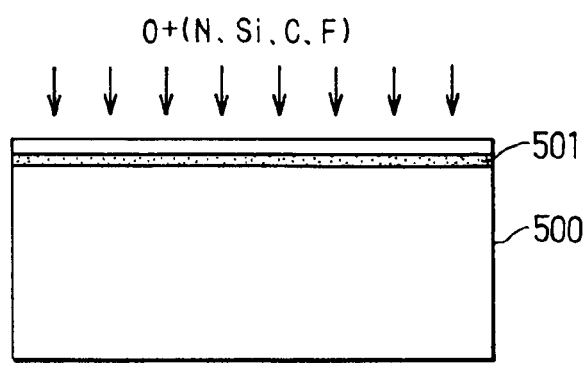

Next, for example, oxygen ions are implanted into the substrate 500 through the pad oxide film at about $1\times10^{16}$ cm$^{-2}$ (FIG. 9B). An acceleration voltage in this case was 100 to 180 KeV in this embodiment, which was determined in accordance with a depth of implantation. Accordingly, nuclei for depositing dissolved oxygen in the substrate 500 can be formed as a deposition nuclear layer 501 shown in FIG. 9B. Implantation of oxygen ions for forming an SOI substrate is known in the SIMOX method; however, in the case of the SIMOX method, a dose is generally about $1\times10^{18}$ cm$^{-2}$, which is larger than that of the present embodiment by two digits.

Figure 9C:
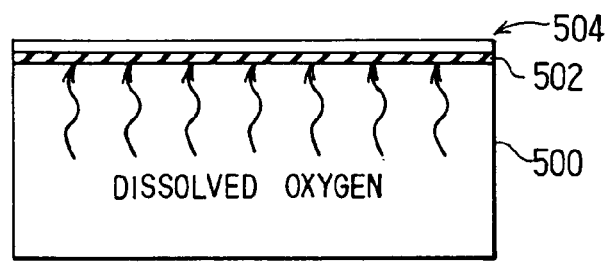

After that, a heat treatment is performed to the semiconductor substrate 500 at a temperature of, for example, 1100° C. or more in nitrogen or oxygen atmosphere for 18 to 35 hours (FIG. 9C). Accordingly, dissolved oxygen in the semiconductor substrate 500 is deposited using implanted oxygen ions as nuclei in the layer 501 so that an oxide layer, i.e., a SiOx layer 502 is formed as shown in FIG. 9C, thereby forming an SOI substrate 504. Here, a value of x was about 2 at the heat treatment conditions described above.

In this embodiment, because the substrate 500 is composed of a high-resistance semiconductor substrate, a high-resistance semiconductor layer underlies the deposited oxide layer 502, and a depletion layer is formed when a voltage is applied across the oxide layer. As a result, a larger withstand voltage than that determined by the thickness of the oxide film can be exhibited. In this embodiment, although oxygen is ion-implanted as an element for forming deposition nuclei, other elements such as nitrogen, silicon, carbon, and fluorine can be used in place of oxygen, which are liable to combine with oxygen to be deposited.

Figure 9D:
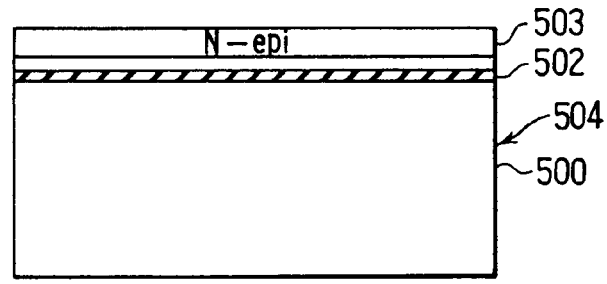

As shown in FIG. 9D, when a semiconductor layer 503 having a predetermined conductive type and a thickness is epitaxially grown on the SOI substrate 504 manufactured as above, an SOI substrate can be formed with desirable film thickness, conductive type, and concentration.

Ninth Embodiment

Figure 10A:
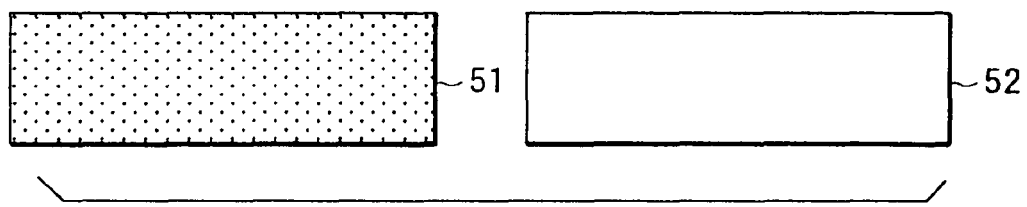
FIGS. 10A to 10D are cross-sectional views showing steps for manufacturing a semiconductor substrate for an SOI semiconductor device in a ninth preferred embodiment.
Figure 10B:
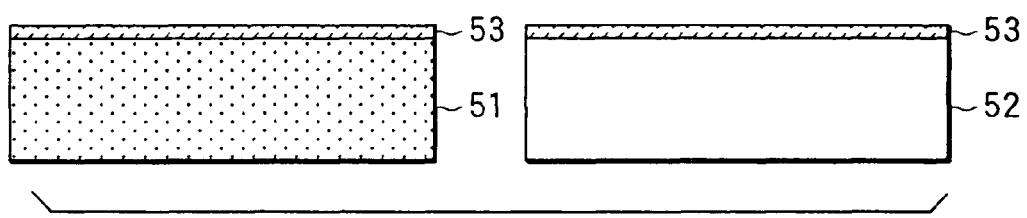
Figure 10C:
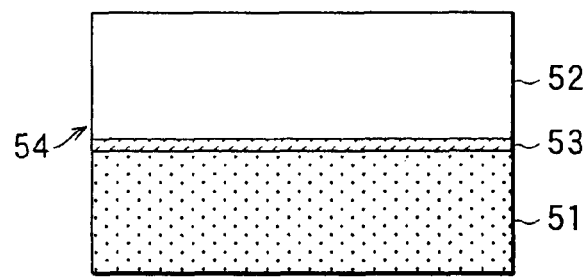
Figure 10D:
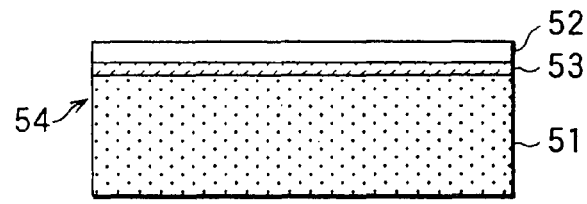

FIGS. 10A to 10D show a ninth preferred embodiment of the present invention. In this embodiment, a high-resistance semiconductor substrate containing interstitial oxygen at a high concentration or semi-insulating substrate as disclosed in the first to three embodiments is prepared as a base wafer 51, and an ordinary mirror wafer is prepared as a bonding wafer 52 (FIG. 10A). Then, an oxide film 53 is formed on a mirror-finished principal surface of at least one of the base wafer 51 and the bonding wafer 52 (FIG. 10B), and the two wafers are bonded together at the principal surfaces thereof in clean atmosphere by an ordinary wafer bonding method, and a high-temperature heat treatment is performed to thereby form a combined wafer 54 (FIG. 10C). After that, the back surface of the combined wafer 54 at the side of the bonding wafer 52 is ground and polished for mirror finishing so that an SOI layer have a predetermined thickness. As a result, an SOI substrate is manufactured (FIG. 10D).

In this embodiment, unlike a conventional manufacturing method, because the high-resistance semiconductor substrate containing interstitial oxygen at a high concentration or semi-insulating substrate is used as the base wafer, an SOI substrate having a high withstand voltage of, for example, 200 V or more can be attained with a thin embedded oxide film thickness of about several hundreds nm that is about $\frac{1}{10}$ thinner than that of a conventional one.

Tenth Embodiment

Figure 11A:
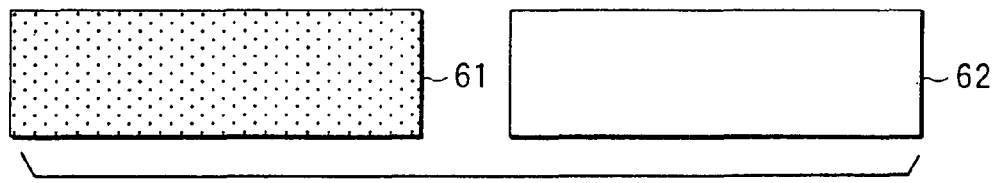
FIGS. 11A to 11E are cross-sectional views showing steps for manufacturing a semiconductor substrate for an SOI semiconductor device in a tenth preferred embodiment.
Figure 11B:
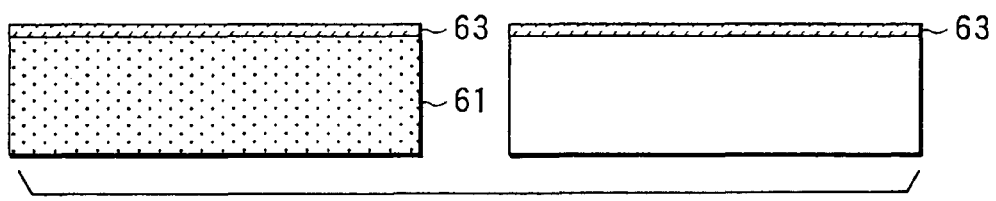
Figure 11C:
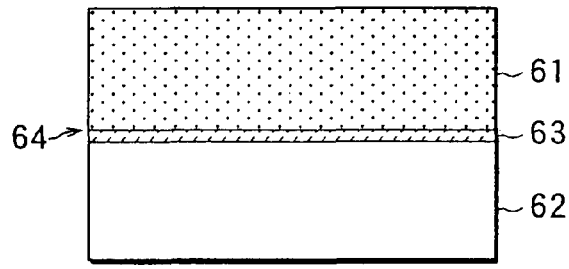

FIGS. 11A to 11E shows a tenth preferred embodiment of the present invention. In this embodiment, a high-resistance semiconductor substrate containing interstitial oxygen at a high concentration or semi-insulating substrate as described in the first to third embodiments is prepared as a bonding wafer 61, while an ordinary mirror wafer is prepared as a base wafer 62 (FIG. 11A). Then, an oxide film 63 is formed on a mirror-finished principal surface of at least one of the bonding wafer 61 and the base wafer 62 (FIG. 11B), and the two wafers are bonded together at the principal surfaces thereof in clean atmosphere by an ordinary wafer bonding method, and a high-temperature heat treatment is performed to thereby form a combined wafer 64 (FIG. 11C).

Figure 11D:
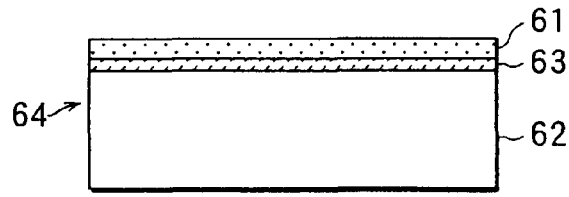
Figure 11E:
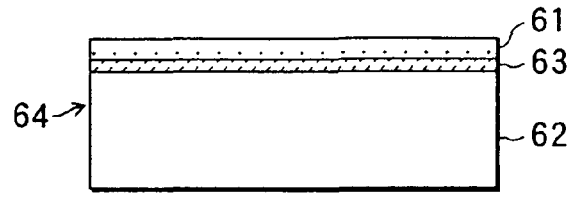

After that, the back surface of the combined wafer 64 at the side of the bonding wafer 61 is ground and polished for mirror finishing. As a result, an SOI substrate is manufactured with an SOI layer having a required thickness (FIG. 11D). Further, oxygen on the SOI layer surface is outwardly diffused by a heat treatment performed at a high temperature in hydrogen atmosphere. Accordingly, oxygen remains at the bonding interface, and gettering sites are formed at that portion (FIG. 1E). The gettering sites formed in the SOI layer can take heavy metal contaminants in when an oxide film is formed on the SOI layer, and therefore lengthen the lifetime of the oxide film.

Figure 12:
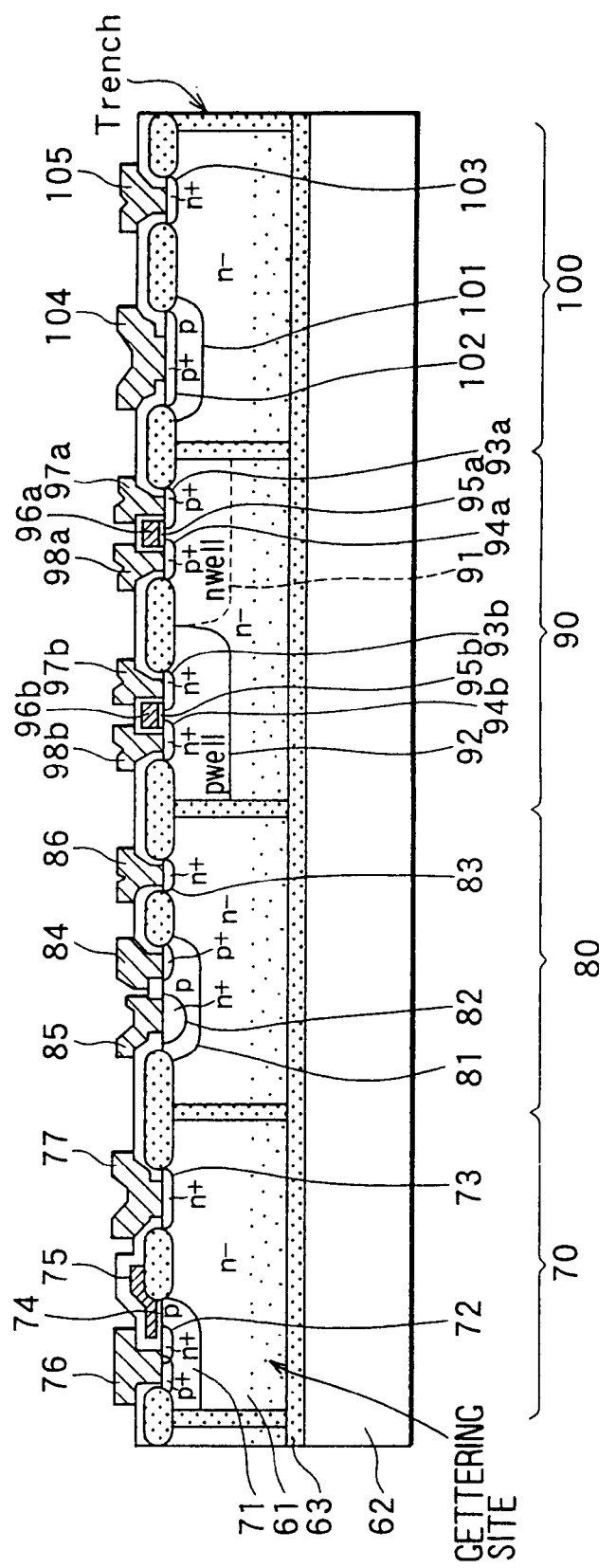
FIG. 12 is a cross-sectional view showing a device adopting the SOI substrate manufactured by the steps shown in FIGS. 11A to 11E.

For example, the SOI substrate manufactured as described in this embodiment can be used for a device shown in FIG. 12. This device is formed with an LDMOS 70, a bipolar transistor 80, a CMOS 90, and a diode 100.

The LDMOS 70 is composed of a p type base region 71 formed at a surface portion of the n⁻ type SOI layer (bonding wafer 61), an n⁺ type source region 72 formed in a surface portion of the p type base region 71, an n⁺ type drain region 73 formed in a surface portion of the SOI layer remotely from the p type base region 71, a gate insulating film 74 formed at least on the p type base region 71, a gate electrode 75 formed on the gate insulating film 74, a source electrode 76 electrically connected to the n⁺ type source region 72, and a drain electrode 77 electrically connected to the n⁺ type drain region 73.

The bipolar transistor 80 is composed of a p type base region 81 formed on a surface portion of the SOI layer, an n⁺ type emitter region 82 formed in a surface portion of the p type base region 81, an n⁺ type collector region 83 formed in a surface portion of the SOI layer remotely from the p type base region 81, and a base electrode 84, an emitter electrode 85, and a collector electrode 86 electrically connected to these regions, respectively.

The CMOS 90 is composed of an n type well layer 91 and a p type well layer 92, which are formed in a surface portion of the SOI layer, p⁺ type source 93a and drain 94a formed in the n type well layer 91 separately from each other, n⁺ type source 93b and drain 94b formed in the p type well layer 92 separately from each other, gate insulating films 95a, 95b and gate electrodes 96a, 96b respectively provided above channel regions between the respective sources 93a, 93b and the respective drains 94a, 94b, source electrodes 97a, 97b respectively connected to the sources 93a, 93b, and drain electrodes 98a, 98b respectively connected to the drains 94a, 94b.

The diode 100 is composed of a p type region 101 and a p⁺ type contact region 102 formed in a surface portion of the SOI layer, an n⁺ type region 103 provided remotely from the p type region 101, and anode and cathode electrodes 104, 105 electrically connected to the respective regions 101, 103.

In this device, because gettering sites are formed in the SOI layer of the SOI substrate manufactured in this embodiment, the following effects can be attained when the SOI substrate is used for the LDMOS 70, the CMOS 90 and the diode 100.

Specifically, in the case of elements such as the LDMOS 70 and the CMOS 90 having the gate insulating films 74, 95a, 95b, because the gettering sites take heavy metal contaminants in, the gate insulating films 74, 95a, 95b can be improved in lifetime. This results in improved reliability of the elements.

Besides, in the case of the CMOS 90 in which both the n type well layer 91 and the p type well layer 92 are formed, it is preferable to isolate the layers from each other by a trench in consideration of latch up prevention. However, there is a case where the trench isolation is not provided to reduce the size of the device. Even in such a case, the gettering sites can prevent latch up.

Further, when an operational state is switched from ON to OFF in the diode 100, holes injected into the n⁻ type SOI layer from the anode electrode return into the anode electrode to generate current flow in an inverse direction. However, if gettering sites exist, the gettering sites trap holes as trap sites, and make the holes recombine with electrons. As a result, the holes disappear apparently, and no current flows in the inverse direction. The diode 100 can be improved in recovery property. Incidentally, though it is not shown in FIG. 12, since an IGBT can have current flow in an inverse direction similarly to the diode 100, the SOI substrate shown in this embodiment can be used for formation of the IGBT to improve the recovery property of the IGBT.

The above-described embodiments exemplify oxygen arranged among lattices other than lattice points; however, oxygen may be arranged at other positions to provide the same effects as described above. Especially, oxygen contained in the semiconductor substrates 1, 21, 31, 41, and 51 may not be interstitial oxygen. Also, in the above-described embodiments, the semiconductor substrates 1, 21, 31, 41, and 51 are respectively composed of high-resistance substrates; however, the substrates can provide the same effects as described above even when they do not have high resistance.

In the first and fifth embodiments, although it is explained that the oxide film is deposited by the heat treatment performed in oxidizing atmosphere, it is possible to deposit other insulting layers. For example, a nitride layer can be deposited using as nuclei partially existing nitrogen in a substrate or the like. Thus, the insulating layer can form an apparent SOI substrate. In this case, the semiconductor substrate has no need to contain oxygen therein.

Incidentally, various insulating isolation structures can be formed by the substrates as manufactured in the above-described embodiments. Examples are shown in FIGS. 13A to 13E, in which a substrate having a PN junction as described in the third embodiment is used, but the other substrates in the other embodiments can also be used as well.

Figure 13A:
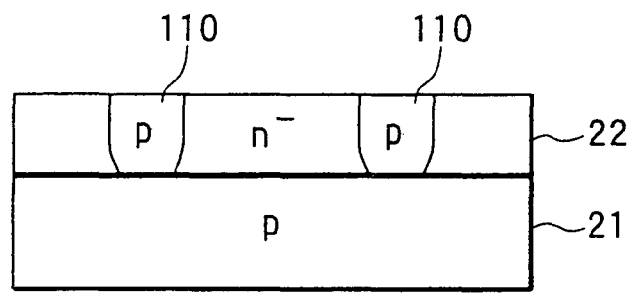
FIGS. 13A to 13E are cross-sectional views showing various insulating isolation structures to which the substrates manufactured in the embodiments of the present invention can be applied.
Figure 13B:
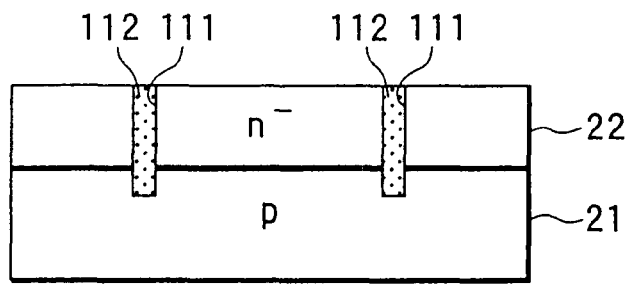
Figure 13C:
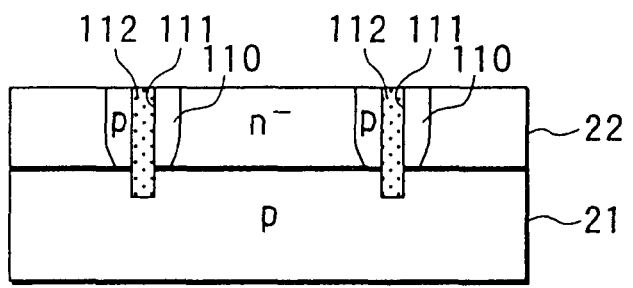
Figure 13D:
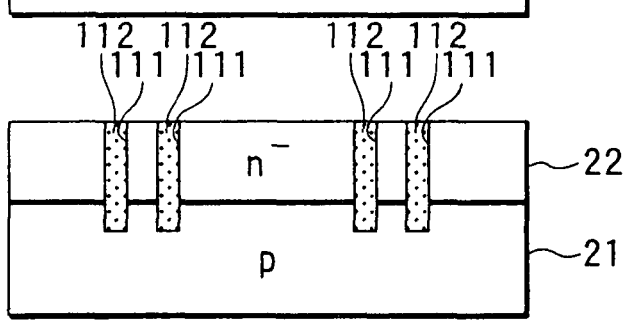
Figure 13E:
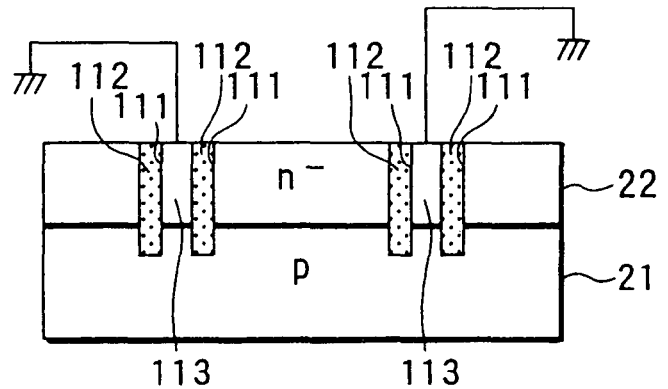

For example, as shown in FIG. 13A, a well-isolation structure is formed by forming a well layer 110 in the n⁻ type epitaxial layer with an inverse conductive type to that of the epitaxial layer 22 to contact the semi-insulating substrate 21. Otherwise, as shown in FIG. 13B, a trench isolation structure can be formed by forming a trench 111 in the epitaxial layer 22 so that the trench reaches the semi-insulating substrate 21, and by filling the trench 111 with an insulating film 112. Otherwise, as shown in FIG. 13C, a well-trench isolation structure can be formed by combining the structures shown in FIGS. 13A and 13B. As shown in FIG. 13D, a double-trench isolation structure may be formed, in which two trenches each of which is similar to that shown in FIG. 13B are formed adjacently to each other. FIG. 13E shows a double-trench isolation structure in which a region interposed between two trenches is made a well layer 113 having the same conductivity type as that of the semi-insulating substrate 21, and the well layer 113 is grounded for parasitic removal.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a semiconductor substrate, comprising:
    preparing a base wafer and a bonding wafer each having a mirror-finished principal surface, one of the base wafer and the bonding wafer being composed of a semiconductor substrate containing oxygen at a high concentration or a semi-insulating semiconductor substrate having a high resistance;
    forming an oxide film on the mirror-finished principal surface of one of the base wafer and the bonding wafer;
    bonding the base wafer and the bonding wafer with the respective mirror-finished principal surfaces facing each other with the oxide film interposed therebetween; and
    grinding and polishing a back surface of the bonding wafer at an opposite side of the base wafer to form an SOI layer on the base wafer through the oxide film,
    wherein when the bonding wafer is composed of the semiconductor wafer containing oxygen at the high concentration or the semi-insulating semiconductor substrate, after grinding and polishing the bonding wafer to form the SOI layer, a heat treatment is performed to the SOI layer on the base wafer in a hydrogen atmosphere to outwardly diffuse oxygen on a surface of the SOI layer and to form a gettering site at a bonding interface.

* * * * *